(12) United States Patent
Huang et al.

(10) Patent No.: US 8,563,370 B2
(45) Date of Patent: Oct. 22, 2013

(54) METHOD FOR FABRICATING SURROUNDING-GATE SILICON NANOWIRE TRANSISTOR WITH AIR SIDEWALLS

(75) Inventors: Ru Huang, Beijing (CN); Jing Zhuge, Beijing (CN); Jiewen Fan, Beijing (CN); Yujie Ai, Beijing (CN); Runsheng Wang, Beijing (CN); Xin Huang, Beijing (CN)

(73) Assignee: Peking University, Beijing (CN)

( * ) Notice: Subject to any disclaimer, the term of this patent is extended or adjusted under 35 U.S.C. 154(b) by 100 days.

(21) Appl. No.: 13/384,215

(22) PCT Filed: Jul. 4, 2011

(86) PCT No.: PCT/CN2011/076805
§ 371 (c)(1),
(2), (4) Date: Jan. 13, 2012

(87) PCT Pub. No.: WO2012/159314
PCT Pub. Date: Nov. 29, 2012

(65) Prior Publication Data
US 2012/0302014 A1    Nov. 29, 2012

(30) Foreign Application Priority Data
May 26, 2011    (CN) .......................... 2011 1 0139058

(51) Int. Cl.
*H01L 21/338*    (2006.01)

(52) U.S. Cl.
USPC ............ 438/164; 438/151; 438/303; 438/595

(58) Field of Classification Search
USPC .......................... 438/151, 154, 164, 303, 595
See application file for complete search history.

(56) References Cited

U.S. PATENT DOCUMENTS

| | | | |
|---|---|---|---|
| 6,268,637 B1 | 7/2001 | Gardner et al. | |
| 8,062,949 B2 * | 11/2011 | Forbes | 438/301 |
| 2008/0001171 A1 * | 1/2008 | Tezuka et al. | 257/191 |
| 2010/0252815 A1 * | 10/2010 | Chidambarrao et al. | 257/24 |
| 2011/0165738 A1 * | 7/2011 | Tezuka et al. | 438/150 |
| 2011/0233512 A1 * | 9/2011 | Yang et al. | 257/9 |

FOREIGN PATENT DOCUMENTS

CN    1416168 A    5/2003

OTHER PUBLICATIONS

International Search Report for International Application No. PCT/CN2011/076805 dated Mar. 15, 2012.

* cited by examiner

*Primary Examiner* — Kevin M Picardat
(74) *Attorney, Agent, or Firm* — Foley & Lardner LLP; Antoinette F. Konski

(57) ABSTRACT

A method for fabricating a surrounding-gate silicon nanowire transistor with air sidewalls is provided. The method is compatible with the CMOS process; the introduced air sidewalls can reduce the parasitic capacitance effectively and increase the transient response characteristic of the device, thus being applicable to a high-performance logic circuit.

9 Claims, 5 Drawing Sheets

METHOD FOR FABRICATING SURROUNDING-GATE SILICON NANOWIRE TRANSISTOR WITH AIR SIDEWALLS

CROSS-REFERENCE TO RELATED APPLICATIONS

This application is a national stage application under 35 U.S.C. §371 of International Application No. PCT/CN2011/076805, filed Jul. 4, 2011, which in turn claims priority under 35 U.S.C. §119(a) to Chinese Patent Application No. 201110139058.0, filed May 26, 2011, the contents of which are hereby incorporated by reference into the present disclosure.

FIELD OF THE INVENTION

The invention relates to a manufacturing technology of an ultra-large-sale integrated circuits, more particularly, to a method for fabricating a surrounding-gate silicon nanowire transistor with air sidewalls.

BACKGROUND OF THE INVENTION

As a device size has been reduced to a deep sub-micrometer, gate control capability of a conventional planar transistor is getting down, and a short channel effect is becoming more and more obvious, thus leading to a series of problems, such as drift of threshold voltage, increase of sub-threshold slope and leakage current in sub-threshold region, drain induced barrier lowering effect and the like. In order to suppress the short channel effect, a multi-gate structure can be used to enhance the control capability for the gate to the channel. An ultimate of the multi-gate structure is a surrounding-gate silicon nanowire structure. Due to an excellent gate-control capability and a one-dimensional quasi-ballistic transport of the surrounding-gate structure, the surrounding-gate silicon nanowire transistor can have an excellent sub-threshold characteristic, an increased current on-off ratio, an enhanced current drivability. Further, it is also well compatible with a CMOS process, and therefore, the surrounding-gate silicon nanowire transistor has been considered to be a promising device that will replace the planar transistor in the future.

However, as shown in FIG. 1, in the surrounding-gate silicon nanowire transistor, a fringing capacitance between the gate and the source/drain may be an unnegligible issue because of the structural characteristics of the surrounding gate and the nanometer-sized channel, thus adversely affecting the transient response characteristics of the device.

In order to reduce the parasitic capacitance, a material with a lower dielectric constant can be used as sidewalls to reduce a capacitive coupling effect between the gate and the source/drain, so that the fringing capacitance can be reduced. To this end, air is one of the materials having a very low dielectric constant. FIG. 2 illustrates a cross-sectional view along a channel direction of the surrounding-gate silicon nanowire transistor with air sidewalls.

Due to a peculiar three dimensional structure of the nanowire, it is required certain special processes to form the air sidewalls, which has not been reported so far in this research area.

SUMMARY OF THE INVENTION

A purpose of the present invention is to provide a method for fabricating a surrounding-gate silicon nanowire transistor with air sidewalls. The transistor is fabricated over a SOI (Silicon-On-Insulator) substrate.

A technical solution of the invention is described as follows.

A method for fabricating a surrounding-gate silicon nanowire transistor with air sidewalls is characterized in that the transistor is fabricated over a SOI substrate, including the following steps:

1) performing an isolation process;
2) depositing a $SiO_2$ layer and depositing a SiN layer;
3) performing a photolithography process to define a channel region and a large source/drain region;
4) transferring a pattern on a photoresist onto SiN and $SiO_2$ hard masks by etching;
5) depositing a layer of material A (such as $SiO_2$, SiN and etc.) having a high etching selection ratio with respect to Si;
6) performing a photolithography process to define a Fin (fin-shaped thin lines) bar;
7) transferring the pattern of the photoresist to the layer of the material A by etching, so as to form a hard mask for the Fin bar and the large source/drain region;
8) etching the Si layer by using the layer of material A and the SiN layer the hard mask, so as to form the Fin bar of Si and the large source/drain;
9) depositing a SiN layer;
10) etching the SiN layer to form SiN sidewalls;
11) performing an oxidization process to form nanowires;
12) removing the oxide layer by using a wet process, so as to form suspended nanowires;
13) forming a gate oxide layer;
14) depositing a polysilicon layer;
15) performing a photolithography process to define a gate line;
16) performing an etching process to transfer the pattern of the photoresist to the polysilicon layer;
17) performing an implantation process on the polysilicon layer and the source/drain region;
18) performing a wet etching process on the SiN layer;
19) depositing a $SiO_2$ layer to form air sidewalls;
20) performing an annealing process to activate impurities;
21) performing subsequent processes by using conventional processes, so that the fabrication of the device is completed.

In the step 1), a silicon island isolation or a local oxidation of silicon (LOCOS) isolation is used.

In the steps 2), 5), 9), 14), 19), a chemical vapor deposition is used.

In the steps 4), 7), 8), 16), an anisotropic dry etching is used.

In the step 10), an anisotropic dry etching is used to ensure SiN remain above the source/drain without being fully removed.

In the step 11), a dry-oxygen oxidation or a hydrogen and oxygen combination oxidation is used.

In the step 12), the oxide layer is removed by using a hydrofluoric acid.

In the step 13), a $SiO_2$ dielectric layer formed by a dry-oxygen oxidation or other dielectric layer with high dielectric constant is used.

In the step 18), SiN is removed by using a concentrated phosphoric acid at 170° C.

The beneficial effects of the invention lie in that, the method for fabricating the surrounding-gate silicon nanowire transistor with air sidewalls according to the invention is compatible with the CMOS process; the introduced air sidewalls can reduce the parasitic capacitance effectively and increase the transient response characteristic of the device, thus being applicable to high-performance logic circuits.

| | |
|---|---|
| 1 | Si |
| 2 | a buried oxide layer |
| 3 | SiN |
| 4 | polysilicon |
| 5 | $SiO_2$ |
| 6 | air |

DETAILED DESCRIPTION OF THE EMBODIMENTS

Hereinafter, the present invention will be further described with reference to accompany drawings and specific embodiments.

Embodiment 1: a process flow for fabricating a surrounding-gate silicon nanowire device with air sidewalls are as follows.

Figure 1:
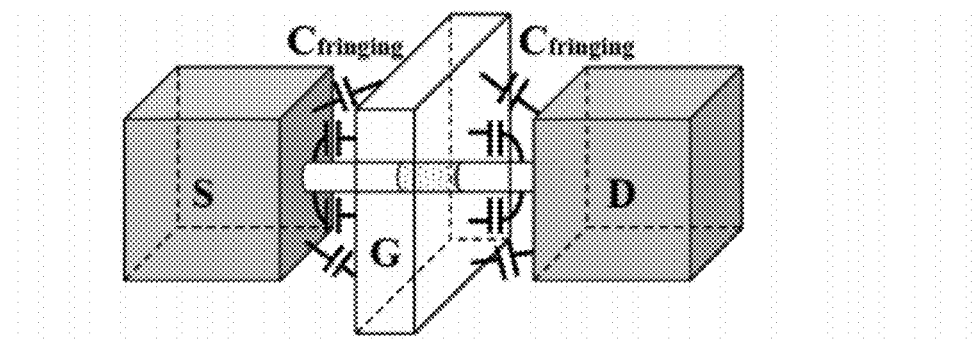
FIG. 1 is a schematic view showing fringing capacitances of a surrounding-gate silicon nanowire device.
Figure 2:
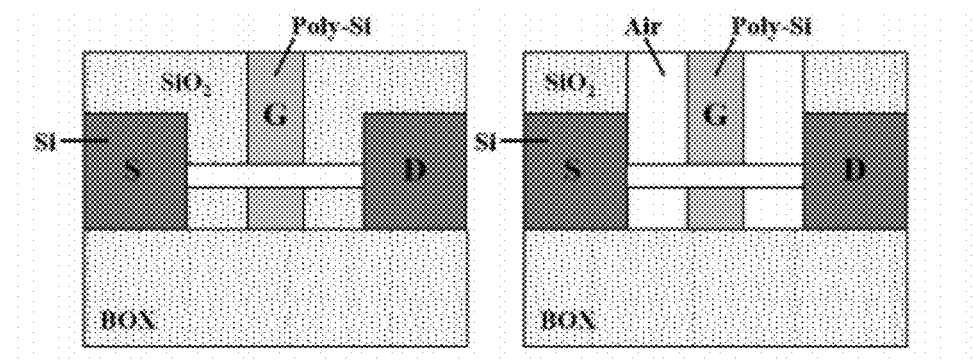
FIG. 2 is cross-sectional views along channel direction of surrounding-gate silicon nanowire devices with $SiO_2$ and air sidewalls respectively.
Figure 3:
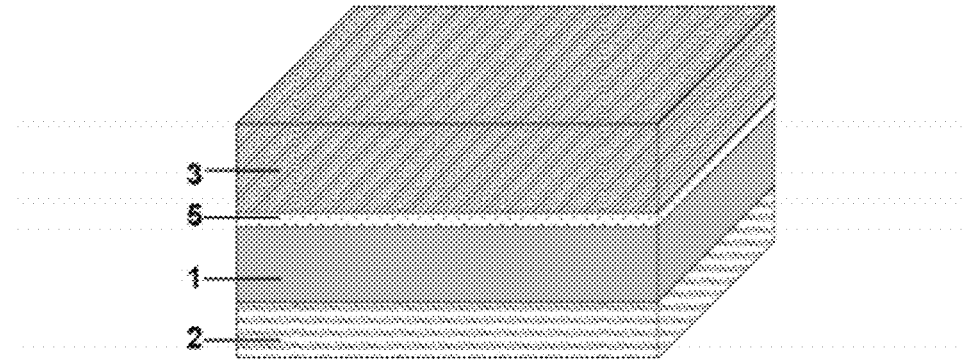
FIGS. 3 to 13 are flow diagrams showing processes implemented in the embodiments of the present invention, in which material of layers are described as follows.
Figure 4:
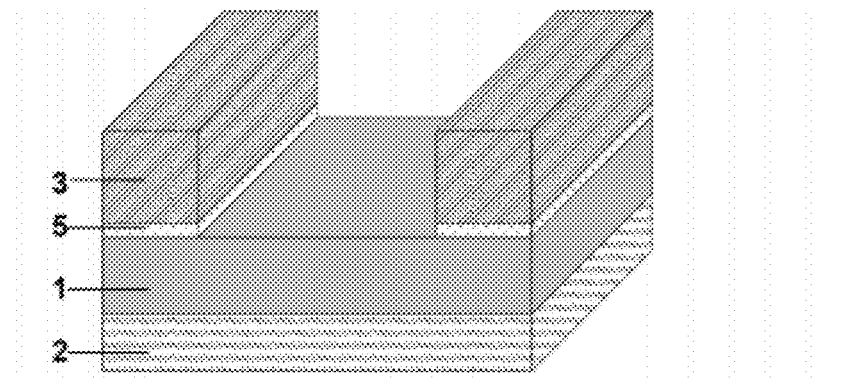
Figure 5:
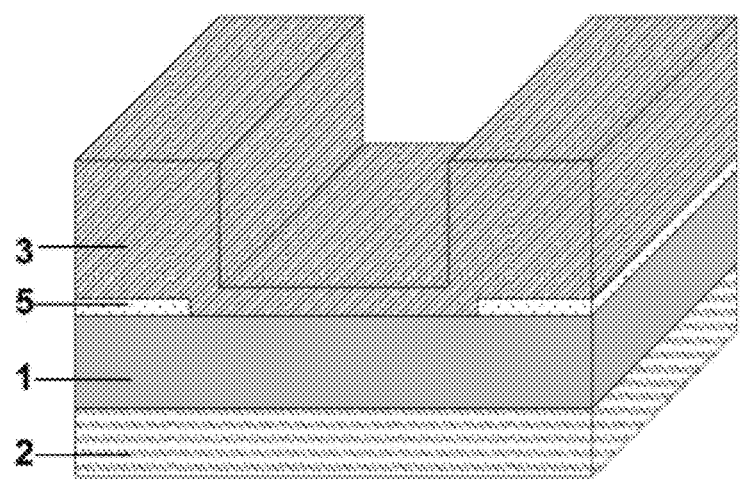
Figure 6:
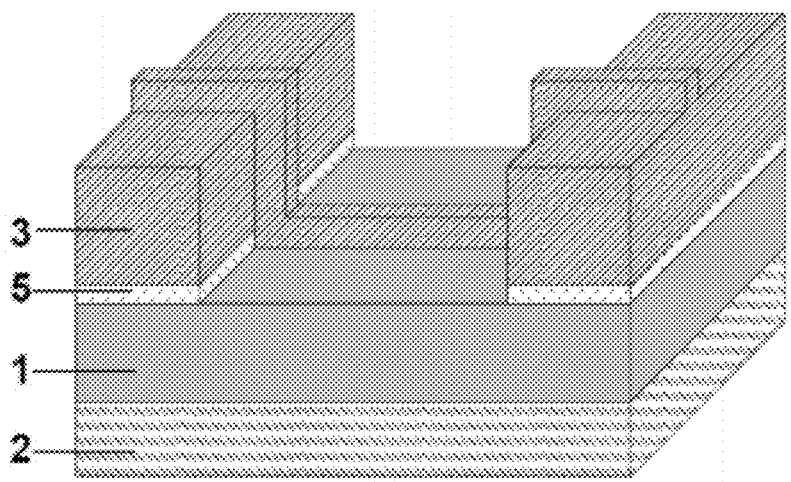
Figure 7:
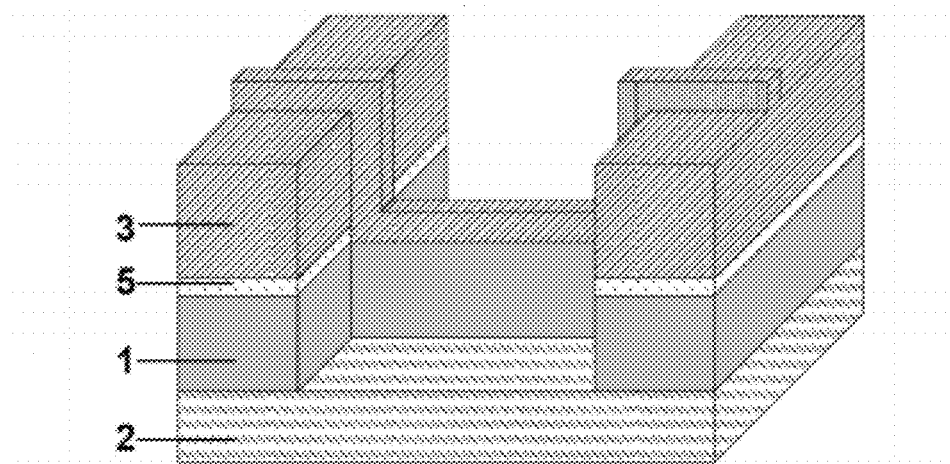
Figure 8:
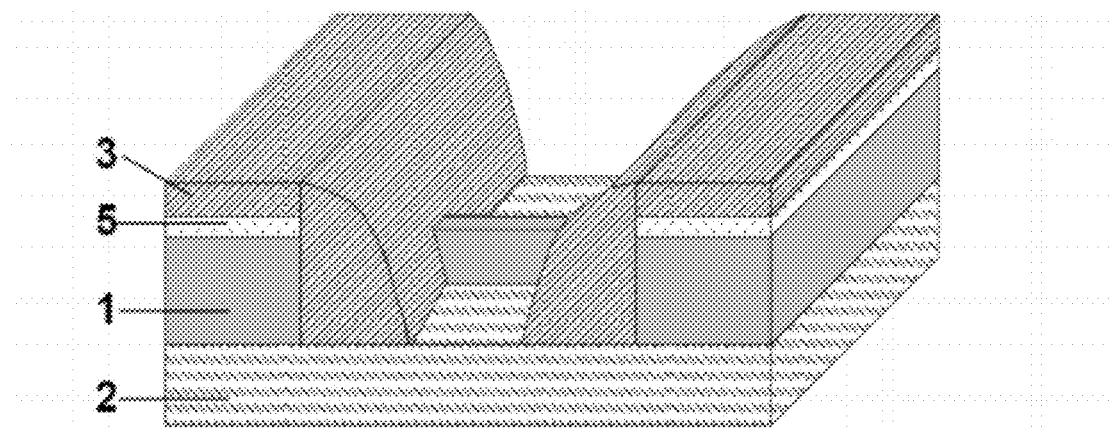
Figure 9:
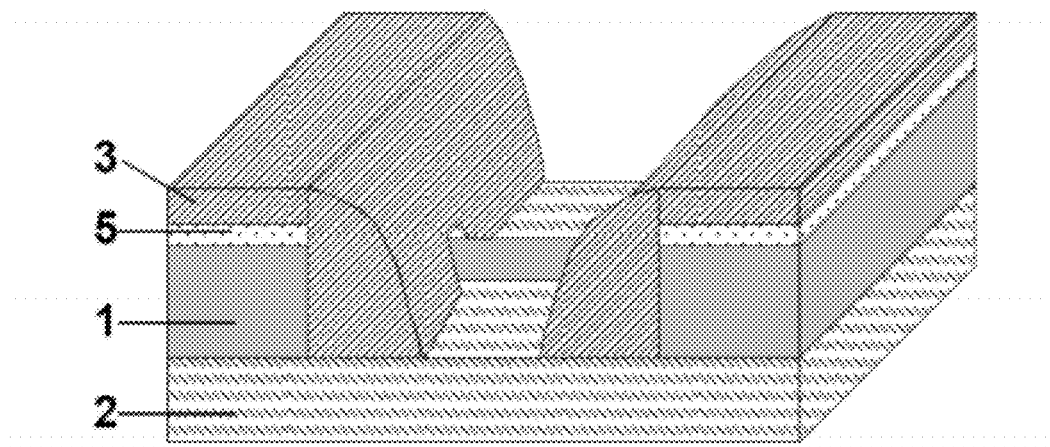
Figure 10:
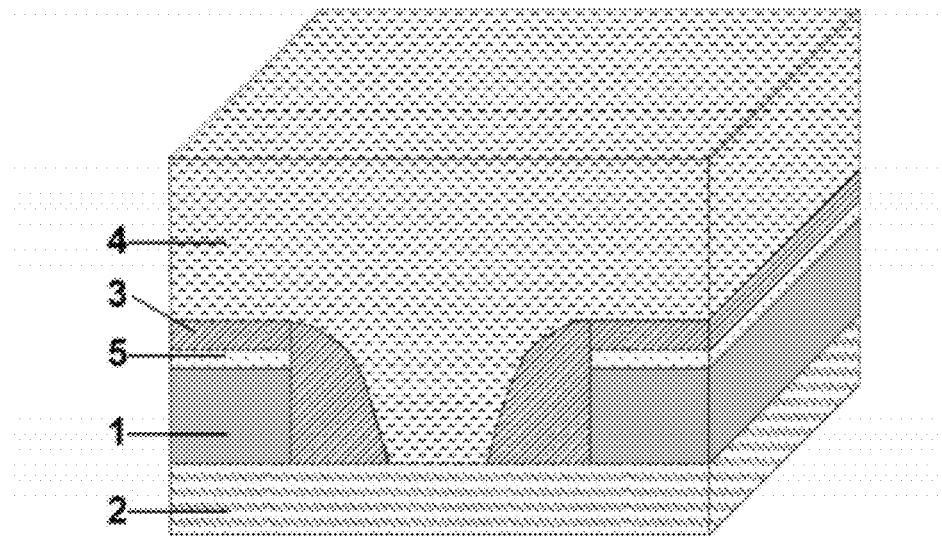
Figure 11:
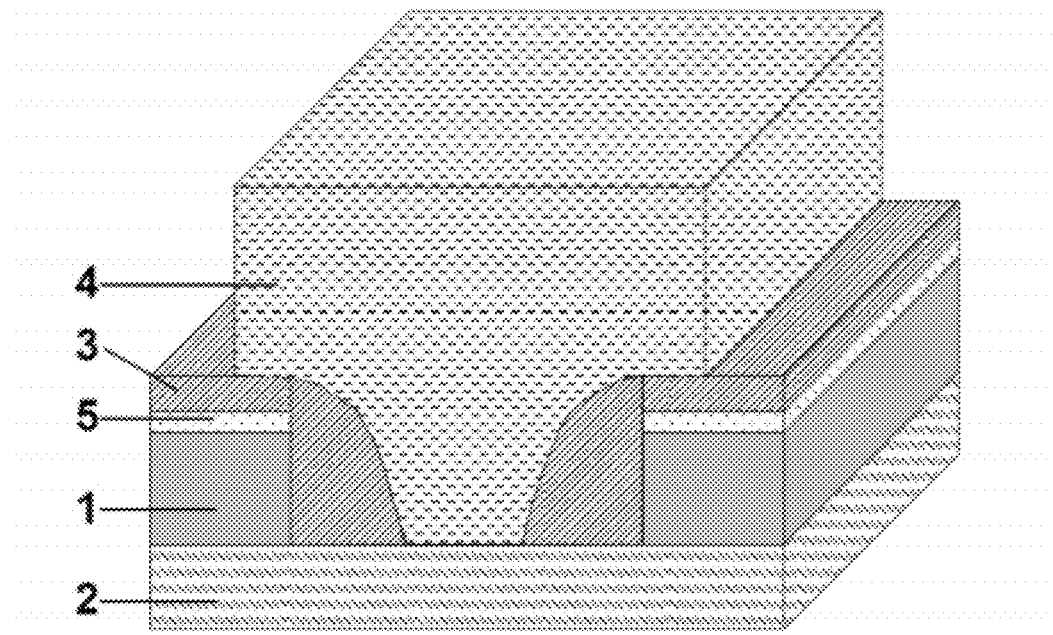
Figure 12:
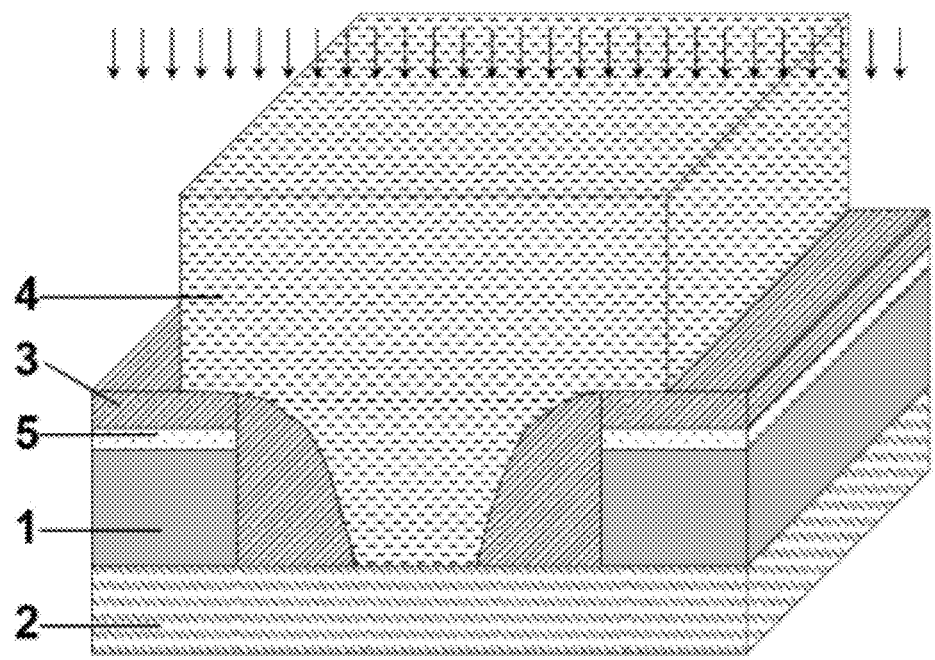
Figure 13:
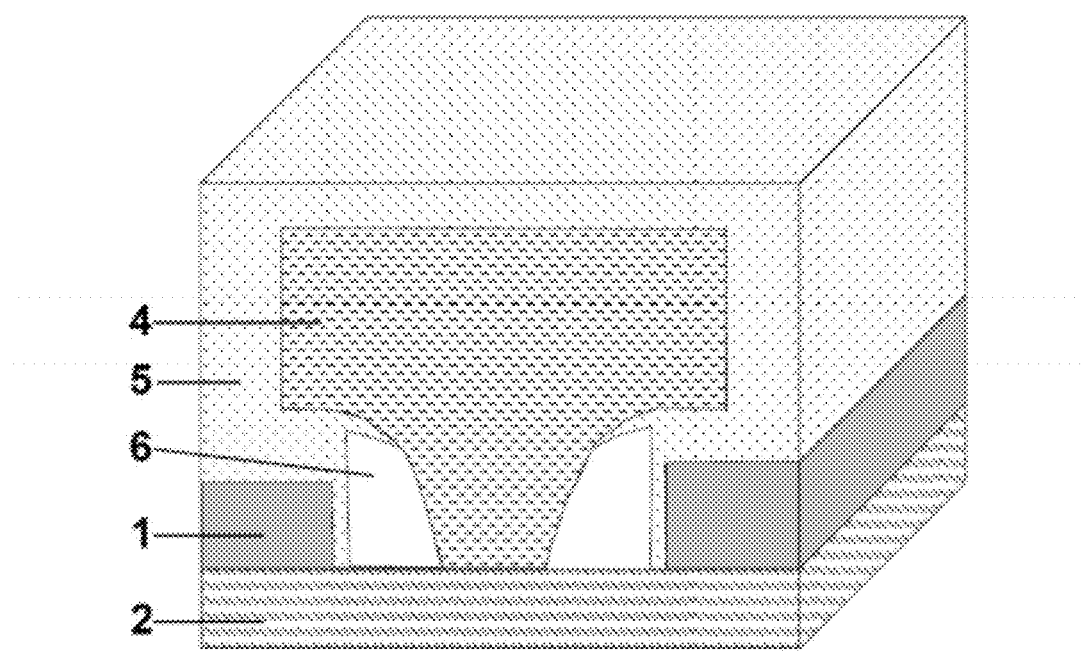

Starting from a SOI substrate (a thickness of a Si layer over a buried oxide layer is 2500 Å):

1. A silicon island isolation is performed.
2. A $SiO_2$ layer is deposited with a thickness of 300 Å by using a low pressure chemical vapor deposition (LPCVD).
3. A SiN layer is deposited with a thickness of 1500 Å by using a low pressure chemical vapor deposition (LPCVD), as shown in FIG. 3.
4. A photolithography process is performed to define a channel region and a large source/drain region.
5. As shown in FIG. 4, the SiN layer is etched by 1500 Å and the $SiO_2$ layer is etched by 300 Å by using a reactive ion etching (RIE) technology, so as to form a hard mask for the large source/drain region; and then the photoresist is removed.
6. A SiN layer is deposited with a thickness of 300 Å, as shown in FIG. 5.
7. A photolithography process is performed to define a hard mark for a Fin bar.
8. As shown in FIG. 6, the SiN layer is etched by 300 Å through a reactive ion etching (RIE) technology, so as to transfer patterns of the photoresist onto the SiN layer to form a Fin hard mask of SiN; and then the photoresist is removed.
9. As shown in FIG. 7, using the SiN layer as a hard mask, the Si layer is etched by 2500 Å using an inductively coupled plasma (ICP) etching, so as to form a Si Fin bar and the large source/drain region.
10. The SiN layer is deposited with a thickness of 1500 Å by using a low pressure chemical vapor (LPCVD) deposition.
11. As shown in FIG. 8, the SiN layer is etched by 2500 Å using a reactive ion etching (RIE), so as to form the SiN sidewalls.
12. A dry-oxygen oxidation is performed to form Si nanowires.
13. As shown in FIG. 9, the $SiO_2$ layer obtained through the dry-oxygen oxidation is etched by using a buffer hydrofluoric acid (BHF), so as to form suspended nanowires.
14. A gate oxidation is performed to form a gate oxide layer with a thickness of 5 nm.
15. Polysilicon is deposited with a thickness of 2000 Å by using a low pressure chemical vapor deposition (LPCVD), as shown in FIG. 10.
16. A photolithography process is performed to define a gate line.
17. As shown in FIG. 11, the polysilicon layer is etched by 2000 Å using an inductively coupled plasma (ICP) etching, so as to form a polysilicon gate; and the photoresist is removed.
18. As shown in FIG. 12, As is implanted with an implantation energy of 50K ev and a implantation dose of $4 \times 10^{15}$ $cm^{-2}$.
19. The SiN layer is selectively etched by using concentrated phosphoric acid at 170°C, so as to completely remove SiN layer over the source/drain as well as the SiN sidewalls.
20. As shown in FIG. 13, a $SiO_2$ layer is deposited with a thickness of 3000 Å by using a low pressure chemical vapor deposition (LPCVD), so as to form air sidewalls.
21. A rapid thermal annealing (RTP) is performed for 5 seconds at 1050 C in nitrogen atmosphere to activate impurities.
22. A photolithography process is performed to define metal contact holes.
23. The $SiO_2$ layer is etched by 3000 Å using a reactive ion etching (RIE), $SiO_2$ remaining in the metal contact holes is etched by using a buffer hydrofluoric acid (BHF), and the photoresist is removed.
24. Ti and Al layers are sputtered with thicknesses of 700 Å and 1 μm respectively.
25. A photolithography process is performed to define metal leading wires.
26. The Al and Ti layers are etched by 1 μm and 700 Å respectively by using a RIE etching, and then the photoresist is removed.
27. An annealing is performed for 30 minutes at 430°C in $N_2+H_2$ atmosphere for alloying and the process is finished.

Embodiment 2: to the difference between Embodiment 1 and Embodiment 2 are as follows.

1. A LOCOS isolation is performed.
6. The $SiO_2$ layer is deposited with a thickness of 300 Å.
8. The $SiO_2$ layer is etched by 300 Å using a reactive ion etching (RIE) technology, so as to transfer the pattern of the photoresist onto the $SiO_2$ layer to form a Fin hard mask of $SiO_2$; and then the photoresist is removed.
9. By using the $SiO_2$ and SiN layers as hard masks, the Si layer is etched by 2500 Å using inductively coupled plasma (ICP) etching, so as to form a Si Fin bar and the large source/drain region.
12. A hydrogen and oxygen combination oxidation is performed to form Si nanowires.
13. The $SiO_2$ layer obtained through the hydrogen and oxygen combination oxidation is etched by using a buffer hydrofluoric acid (BHF), so as to form suspended nanowires.

What is claimed is:
1. A method for fabricating a surrounding-gate silicon nanowire transistor with air sidewalls, wherein the transistor is fabricated over a SOI substrate, comprising the following steps:
   1) performing an isolation process;
   2) depositing a $SiO_2$ layer and a SiN layer;
   3) performing a photolithography process to define a channel region and a large source/drain region;

4) performing an etching process to transfer a pattern of a photoresist to SiN and SiO$_2$ hard masks;
5) depositing a layer of material A having a high etching selection ratio with respect to Si;
6) performing a photolithography process to define a Fin bar;
7) performing an etching process to transfer the pattern of the photoresist to the layer of material A, so as to form a hard mask for the Fin bar and the large source/drain region;
8) performing an etching process on the Si layer using the layer of material A and the SiN layer as the hard mask, so as to form the Fin bar of Si and the large source/drain region;
9) depositing a SiN layer;
10) etching the SiN layer to form SiN sidewalls;
11) performing an oxidization process to form a nanowire;
12) removing an oxide layer by using a wet etch process, so as to form a suspended nanowire;
13) forming a gate oxide layer;
14) depositing a polysilicon layer;
15) performing a photolithography process to define a gate line;
16) performing an etching process to transfer the pattern of the photoresist to the polysilicon layer;
17) performing an implantation process on the polysilicon layer and the source/drain region;
18) performing a wet etch process on the SiN layer;
19) depositing a SiO$_2$ layer to form an air sidewall;
20) performing an annealing process to activate impurities;
21) performing subsequent processes by using conventional processes, so as to complete the fabrication.

2. The method according to claim 1, wherein a silicon island isolation or a local oxidation of silicon isolation is used in step 1).

3. The method according to claim 1, wherein a chemical vapor deposition is used in steps 2), 5), 9), 14), and 19.

4. The method according to claim 1, wherein an anisotropic dry etching is used in steps 4), 7), 8), and 16).

5. The method according to claim 1, wherein an anisotropic dry etching is used to ensure a part of the SiN layer remain on the source/drain region without being removed in step 10).

6. The method according to claim 1, wherein a dry-oxygen oxidation or a hydrogen and oxygen combination oxidation is used in step 11).

7. The method according to claim 1, wherein the oxide layer is removed by using a hydrofluoric acid in step 12).

8. The method according to claim 1, wherein a SiO$_2$ dielectric layer is formed by using a dry-oxygen oxidation in step 13).

9. The method according to claim 1, wherein the SiN layer is removed by using a concentrated phosphoric acid at 170° C. in step 18).

* * * * *